(12) United States Patent
Tapily

(10) Patent No.: US 11,251,077 B2
(45) Date of Patent: Feb. 15, 2022

(54) METHOD OF FORMING A SEMICONDUCTOR DEVICE WITH AIR GAPS FOR LOW CAPACITANCE INTERCONNECTS

(71) Applicant: Tokyo Electron Limited, Tokyo (JP)

(72) Inventor: Kandabara Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 353 days.

(21) Appl. No.: 16/379,402

(22) Filed: Apr. 9, 2019

(65) Prior Publication Data

US 2019/0311947 A1 Oct. 10, 2019

Related U.S. Application Data

(60) Provisional application No. 62/654,760, filed on Apr. 9, 2018.

(51) Int. Cl.
| | | |
|---|---|---|
| *C23C 16/455* | (2006.01) | |
| *C23C 16/40* | (2006.01) | |
| *H01L 21/285* | (2006.01) | |
| *H01L 21/764* | (2006.01) | |
| *H01L 21/768* | (2006.01) | |
| *C23C 16/04* | (2006.01) | |
| *H01L 21/02* | (2006.01) | |

(52) U.S. Cl.
CPC ...... *H01L 21/76877* (2013.01); *C23C 16/045* (2013.01); *C23C 16/402* (2013.01); *C23C 16/4554* (2013.01); *C23C 16/45534* (2013.01); *C23C 16/45553* (2013.01); *H01L 21/0228* (2013.01); *H01L 21/02164* (2013.01); *H01L 21/02216* (2013.01); *H01L 21/02274* (2013.01); *H01L 21/28556* (2013.01); *H01L 21/764* (2013.01); *H01L 21/02186* (2013.01)

(58) Field of Classification Search
CPC ........ H01L 21/02164; H01L 21/02216; H01L 21/0228; H01L 21/28556; H01L 21/764; H01L 21/76877; C23C 16/045; C23C 16/402; C23C 16/45534; C23C 16/45553
See application file for complete search history.

(56) References Cited

U.S. PATENT DOCUMENTS

| | | | |
|---|---|---|---|
| 9,159,606 B1 | 10/2015 | Purayath et al. | |
| 2005/0006686 A1* | 1/2005 | Saida | H01L 27/10861 257/301 |
| 2012/0040534 A1 | 2/2012 | McGinnis et al. | |
| 2013/0164942 A1* | 6/2013 | Kato | C23C 16/45536 438/758 |

(Continued)

FOREIGN PATENT DOCUMENTS

KR 101402962 B1 6/2014

OTHER PUBLICATIONS

Korean Intellectual Property Office, The International Search Report and the Written Opinion for international application No. PCT/US2019/026590, dated Jul. 22, 2019, 10pp.

*Primary Examiner* — Eduardo A Rodela
*Assistant Examiner* — Christopher M Roland

(57) ABSTRACT

A method of fabricating air gaps in advanced semiconductor devices for low capacitance interconnects. The method includes exposing a substrate to a gas pulse sequence to deposit a material that forms an air gap between raised features.

10 Claims, 6 Drawing Sheets

(56) References Cited

U.S. PATENT DOCUMENTS

| | | | | |
|---|---|---|---|---|
| 2014/0070293 A1* | 3/2014 | Li | ..................... | H01L 27/1203 |
| | | | | 257/301 |
| 2017/0229337 A1* | 8/2017 | Park | ..................... | C23C 16/045 |
| 2017/0358481 A1 | 12/2017 | Lin | | |
| 2018/0061628 A1* | 3/2018 | Ou | ..................... | H01L 21/3065 |
| 2018/0294181 A1* | 10/2018 | Tapily | ............... | H01L 21/02178 |
| 2019/0051521 A1* | 2/2019 | Tapily | ............... | H01L 21/02186 |
| 2019/0103363 A1* | 4/2019 | Yu | ..................... | H01L 21/28568 |
| 2019/0157274 A1* | 5/2019 | Chang | ................ | H01L 29/4991 |
| 2019/0382897 A1* | 12/2019 | Tabata | .............. | H01J 37/32082 |

\* cited by examiner

```
┌─────────────────────────────────────┐
│ PROVIDING A SUBSTRATE CONTAINING    │
│ RAISED FEATURES WITH TOP AREAS AND  │──── 100
│ SIDEWALLS, AND BOTTOM AREAS BETWEEN │
│ THE RAISED FEATURES                 │
└─────────────────────────────────────┘
                  │
                  ▼
┌─────────────────────────────────────┐
│ SEQUENTIALLY FIRST, EXPOSING THE    │
│ SUBSTRATE TO A FIRST PRECURSOR GAS TO│
│ NON-CONFORMALLY FORM A FIRST        │
│ PRECURSOR LAYER ON THE TOP AREAS AND│
│ ON THE UPPER PARTS OF THE SIDEWALLS,│
│ BUT NOT ON THE LOWER PARTS OF THE   │──── 102
│ SIDEWALLS AND THE BOTTOM AREAS, AND │
│ SECOND, EXPOSING THE SUBSTRATE TO A │
│ SECOND PRECURSOR GAS THAT REACTS    │
│ WITH THE FIRST PRECURSOR LAYER TO FORM│
│ A FIRST LAYER OF A MATERIAL ON THE  │
│ SUBSTRATE                           │
└─────────────────────────────────────┘
                  │
                  ▼
┌─────────────────────────────────────┐
│ SEQUENTIALLY FIRST, EXPOSING THE    │
│ SUBSTRATE TO THE FIRST PRECURSOR    │
│ GAS TO CONFORMALLY FORM A SECOND    │
│ PRECURSOR LAYER ON THE TOP AREAS,   │
│ ON THE SIDEWALLS, AND ON THE BOTTOM │
│ AREAS, AND SECOND, EXPOSING THE     │──── 104
│ SUBSTRATE TO THE SECOND             │
│ PRECURSOR GAS THAT REACTS WITH      │
│ THE SECOND PRECURSOR LAYER TO       │
│ FORM A SECOND LAYER OF THE          │
│ MATERIAL ON THE SUBSTRATE           │
└─────────────────────────────────────┘
```

FIG. 1

METHOD OF FORMING A SEMICONDUCTOR DEVICE WITH AIR GAPS FOR LOW CAPACITANCE INTERCONNECTS

CROSS-REFERENCE TO RELATED APPLICATIONS

This application is related to and claims priority to U.S. Provisional Patent Application Ser. No. 62/654,760 filed on Apr. 9, 2018, the entire contents of which are herein incorporated by reference.

FIELD OF INVENTION

The present invention relates to the field of semiconductor manufacturing and semiconductor devices, and more particularly, to a method of forming a semiconductor device with air gaps for low capacitance interconnects.

BACKGROUND OF THE INVENTION

As device feature size is scaled, interconnects are becoming a significant problem in performance improvement. This is in part due to an increase in electrical resistivity (Rs) with ever decreasing device feature sizes and detrimental capacitance between adjacent features. One way of reducing capacitance is using ultra low-k dielectric materials, but air gaps offer the lowest dielectric constant (k) value of approximately 1. As a result, device manufacturers are adding air gaps to critical layers in advanced metallization schemes.

SUMMARY OF THE INVENTION

This disclosure describes a novel method of fabricating air gaps in advanced semiconductor devices. According to one embodiment, the method includes providing a substrate containing raised features with top areas and sidewalls, and bottom areas between the raised features, and exposing the substrate to a gas pulse sequence to deposit a material that forms an air gap between the raised features, where the gas pulse sequence includes, in any order: a) sequentially first, exposing the substrate to a first precursor gas to non-conformally form a first precursor layer on the top areas and on the upper parts of the sidewalls, but not on the lower parts of the sidewalls and the bottom areas, and second, exposing the substrate to a second precursor gas that reacts with the first precursor layer to form a layer of the material on the substrate, and b) sequentially first, exposing the substrate to the first precursor gas to conformally form a second precursor layer on the top areas, on the sidewalls, and on the bottom areas, and second, exposing the substrate to the second precursor gas that reacts with the second precursor layer to form a second layer of the material on the substrate. The steps a), b), or a) and b), may be repeated at least once until the air gap is formed.

According to another embodiment, the method includes providing a substrate containing raised features with top areas and sidewalls, and bottom areas between the raised features, and exposing the substrate to a gas pulse sequence to deposit a material that forms an air gap between the raised features, where the gas pulse sequence includes, in any order: a) sequentially first, exposing the substrate to a first precursor gas to conformally form a first precursor layer on the top areas, on the sidewalls, and on the bottom areas, second, exposing the substrate to a plasma-excited halogen-containing gas to deactivate or at least partially remove the first precursor layer in the top areas and the bottom areas, and third, exposing the substrate to the second precursor gas that reacts with the first precursor layer to form a layer of the material on the sidewalls, and b) sequentially first, exposing the substrate to the first precursor gas to conformally form a second precursor layer on the top areas, on the sidewalls, and on the bottom areas, and second, exposing the substrate to the second precursor gas that reacts with the second precursor layer to form a second layer of the material on the substrate. The steps a), b), or a) and b), may be repeated at least once until the air gap is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a process flow diagram for processing a substrate according to an embodiment of the invention;

DETAILED DESCRIPTION OF SEVERAL EMBODIMENTS

Figure 2A:
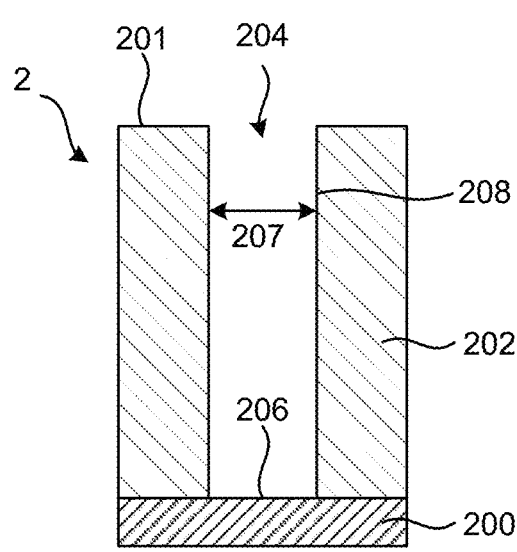
FIGS. 2A-2F schematically show through cross-sectional views a method of processing a substrate according to an embodiment of the invention.

A method of fabricating air gaps in advanced semiconductor devices is described. FIG. 1 is a process flow diagram for processing a substrate according to an embodiment of the invention, and FIGS. 2A-2F schematically show through cross-sectional views a method of processing a substrate according to an embodiment of the invention.

The process flow 1 in FIG. 1 includes in 100, providing a substrate 2 containing a base film 200 and raised features 202 with top areas 201 and sidewalls 208, and bottom areas 206 between the raised features 202. The raised features 202 define a recessed feature 204 between the raised features 202. The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed feature 204 can, for example, have a depth of 25 nm, 50 nm, 100 nm, 200 nm, or greater.

In some examples, the base film 200 and the raised features 202 may contain or consist of the same material. In one example, the base film 200 and the raised features 202 may contain or consist of Si. In some examples, the raised features 202 may contain a dielectric material, for example $SiO_2$, SiON, SiN, a high-k material, a low-k material, or an ultra-low-k material. The recessed feature 204 may be formed using well-known lithography and etching processes.

Figure 2B:
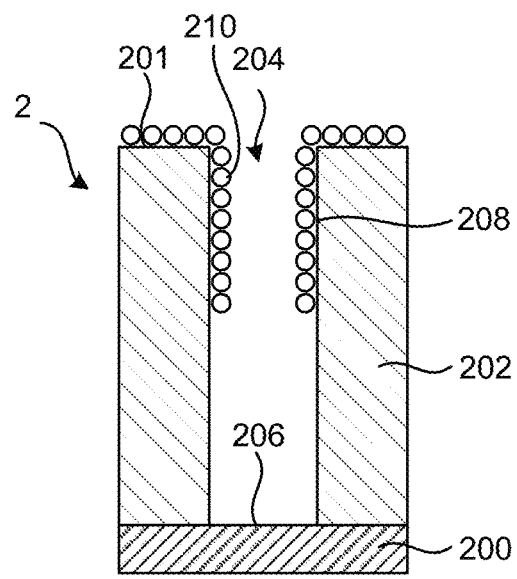
Figure 2C:
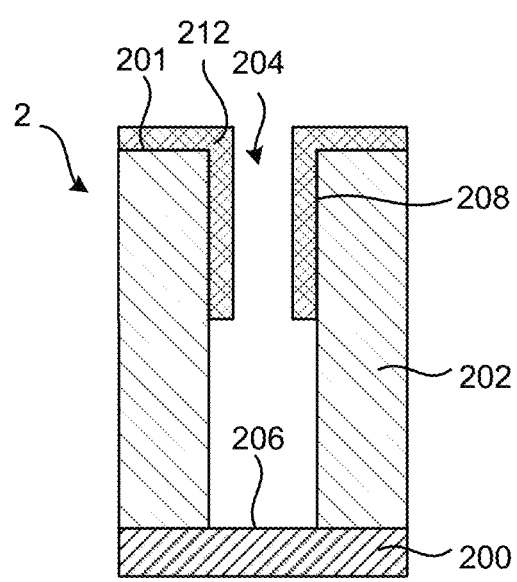
Figure 2D:
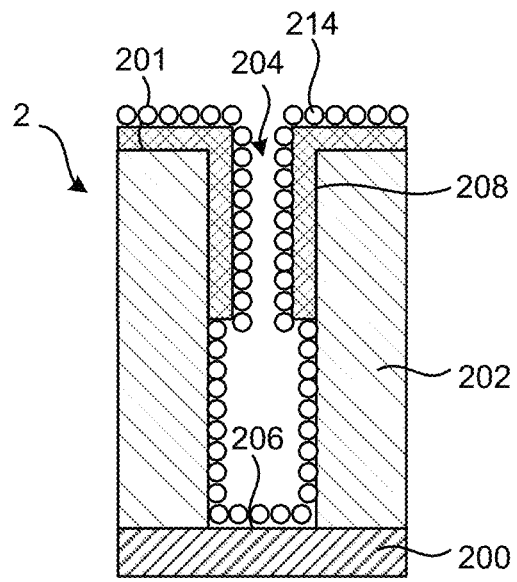
Figure 2E:
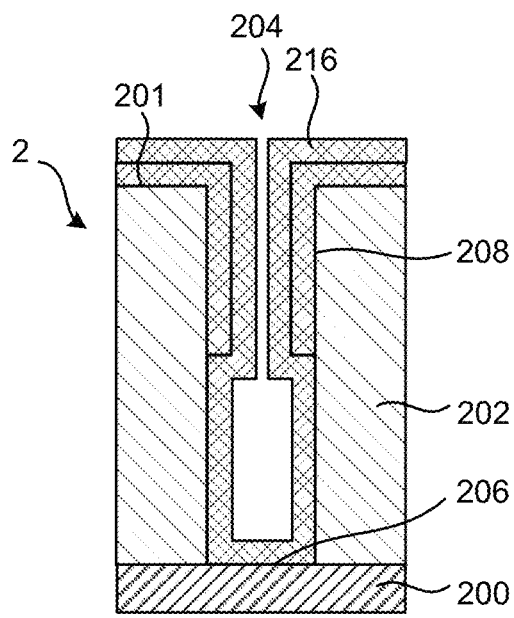

The process flow 1 further includes exposing the substrate 2 to a gas pulse sequence to deposit a material that forms an air gap on the substrate 2, where the gas pulse sequence includes, in any order: in 102, sequentially first, exposing the substrate to a first precursor gas to non-conformally form a first precursor layer on the top areas and on the upper parts of the sidewalls, but not on the lower parts of the sidewalls and the bottom areas (FIG. 2B), and second, exposing the substrate to a second precursor gas that reacts with the first precursor layer to form a first layer of the material on the substrate (FIG. 2C), and in 104, sequentially first, exposing the substrate to the first precursor gas to conformally form a second precursor layer on the top areas, on the sidewalls, and on the bottom areas (FIG. 2D), and second, exposing the substrate to the second precursor gas that reacts with the second precursor layer form a second layer of the material on the substrate (FIG. 2E).

FIG. 2B schematically shows a first precursor layer 210 that is non-conformally formed on the top areas 201 and on the upper parts of the sidewalls 208, but not on the lower parts of the sidewalls 208 and the bottom areas 206. According to embodiments of the invention, the first precursor layer 210 may be deposited or formed by various methods including a) controlling the saturation regime at the substrate using an undersaturated exposure of the first precursor gas that results in depletion of the first precursor gas in the recessed feature 204, b) pressure control at the substrate to limit the diffusion of the first precursor gas to the bottom areas 206, c) spatial rapid horizontal movement of a rotating substrate below a gas inlet dispensing the first precursor gas during an atomic layer deposition (ALD) process, or d) plasma densification of a conformal precursor layer on the top areas 201 and on the upper parts of the sidewalls 208, followed by etching of the conformal precursor layer on the lower parts of the sidewalls 208 and on the bottom areas 206.

FIG. 2C shows the formation of a first layer of material 212 from exposure of the second precursor gas that reacts with the first precursor layer 210 in FIG. 2B.

FIG. 2D shows a second precursor layer 214 that is conformally formed on the top areas 201, on the sidewalls 208, and on the bottom areas 206. The second precursor layer 214 may be deposited using a saturated exposure of the first precursor gas that reaches and saturates the bottom areas 206 between the raised features 202.

FIG. 2E shows the formation of a second layer of material 216 from exposure of the second precursor gas that reacts with the second precursor layer 214 in FIG. 2D.

Figure 2F:
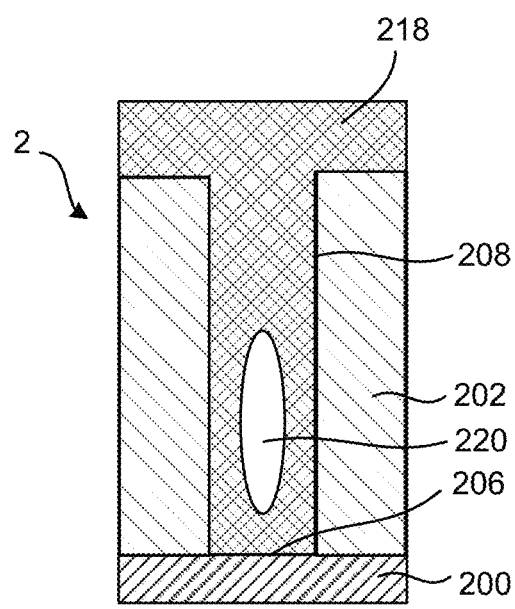

Steps 102, 104, or both 102 and 104, may be repeated at least once until an air gap is formed on the substrate 2. Steps 102 and 104 may be performed in any order, i.e., step 102 before step 104, or step 104 before step 102. FIG. 2F shows the formation of an air gap 220 in the material 218 following deposition of additional material until the recessed feature 204 is pinched off near the top. The material 218 containing the air gap 220 includes the first layer of material 212, the second layer of material 216, and any further materials needed to close the opening near the top of the recessed feature 204.

In one example, the first precursor gas can include a metal-containing precursor and the first and second precursor layers 210 and 214 can form an adsorbed layer of the first precursor that is approximately one atomic layer thick.

In some examples, the metal-containing precursor contains aluminum, titanium, or a combination thereof. Examples of metal-containing precursor include aluminum (Al), titanium (Ti), or both aluminum and titanium. According to one embodiment, the first and second precursor layers 210 and 214 are selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

Embodiments of the invention may utilize a wide variety of Al-containing precursors. For example, many aluminum precursors have the formula: $AlL_1L_2L_3D_x$ where $L_1$, $L_2$, $L_3$ are individual anionic ligands, and D is a neutral donor ligand where x can be 0, 1, or 2. Each $L_1$, $L_2$, $L_3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(O^sBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^tBu)_2Cl$, $Al(^iBu)_3$, $Al(^iBu)_2H$, $AlEt_2Cl$, $Et_3Al_2(O^sBu)_3$, and $Al(THD)_3$.

Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta5-C_5H_5)_2Cl$, $Ti(\eta5-C_5H_5)Cl_2$, $Ti(\eta5-C_5H_5)Cl_3$, $Ti(\eta5-C_5H_5)_2Cl_2$, $Ti(\eta5-C_5(CH_3)_5)Cl_3$, $Ti(CH_3)(\eta5-C_5H_5)_2Cl$, $Ti(\eta5-C_9H_7)_2Cl_2$, $Ti((\eta5-C_5(CH_3)_5)_2Cl$, $Ti((\eta5-C_5(CH_3)_5)_2Cl_2$, $Ti(\eta5-C_5H_5)_2(\mu-Cl)_2$, $Ti(\eta5-C_5H_5)_2(CO)_2$, $Ti(CH_3)_3(\eta5-C_5H_5)$, $Ti(CH_3)_2(\eta5-C_5H_5)_2$, $Ti(CH_3)_4$, $Ti(\eta5-C_5H_5)(\eta7-C_7H_7)$, $Ti(\eta5-C_5H_5)(\eta8-C_8H_8)$, $Ti(C_5H_5)_2(\eta5-C_5H_5)_2$, $Ti((C_5H_5)_2)_2(\eta-H)_2$, $Ti(\eta5-C_5(CH_3)_5)_2$, $Ti(\eta5-C_5(CH_3)_5)_2(H)_2$, and $Ti(CH_3)_2(\eta5-C_5(CH_3)_5)_2$. $TiCl_4$ is an example of a titanium halide precursor containing a "Ti-halogen" bond.

According to some embodiments, the second precursor gas may include a silanol gas and the material deposited on the substrate can include $SiO_2$. In some examples, the silanol gas may be selected from the group consisting of tris(tert-pentoxy) silanol (TPSOL), tris(tert-butoxy) silanol, and bis(tert-butoxy)(isopropoxy) silanol.

In the absence of any oxidizing and hydrolyzing agent, the substrate may be exposed, at a substrate temperature of approximately 150° C. or less, to a process gas containing a silanol gas to deposit a $SiO_2$ film. The thickness of the $SiO_2$ film is controlled by self-limiting adsorption of the silanol gas on the precursor layer. This catalytic effect has been observed until the $SiO_2$ films were about 3 nm thick, thereafter the $SiO_2$ deposition stopped. In another embodiment, the substrate temperature may be approximately 120° C. or less. In yet another embodiment, the substrate temperature may be approximately 100° C. or less.

Figure 5:
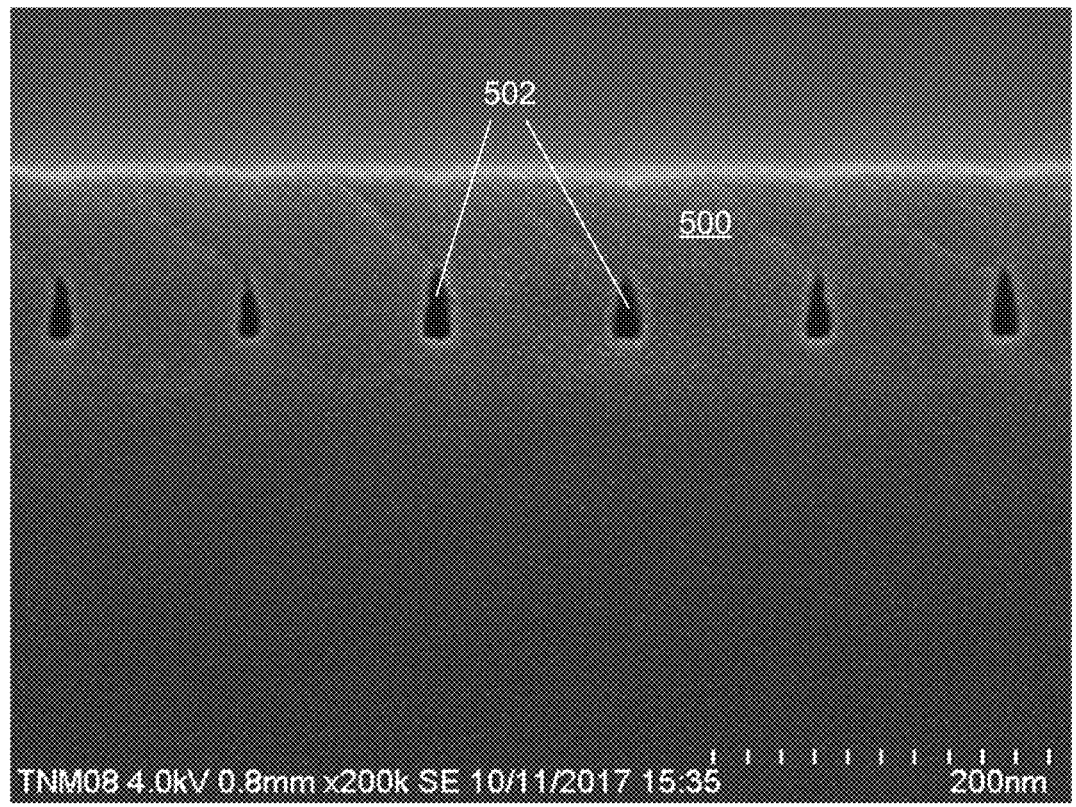
FIG. 5 shows a cross-sectional scanning electron micrograph (SEM) image of air gaps formed in a $SiO_2$ material according to an embodiment of the invention.

FIG. 5 shows a cross-sectional scanning electron micrograph (SEM) image of air gaps 502 formed in a $SiO_2$ material 500 according to an embodiment of the invention. The $SiO_2$ material 500 was deposited over raised features according to the embodiment described in FIGS. 1 and 2A-2F. The first precursor contained $AlMe_3$ and the second precursor contained tris(tert-pentoxy) silanol.

Figure 3:
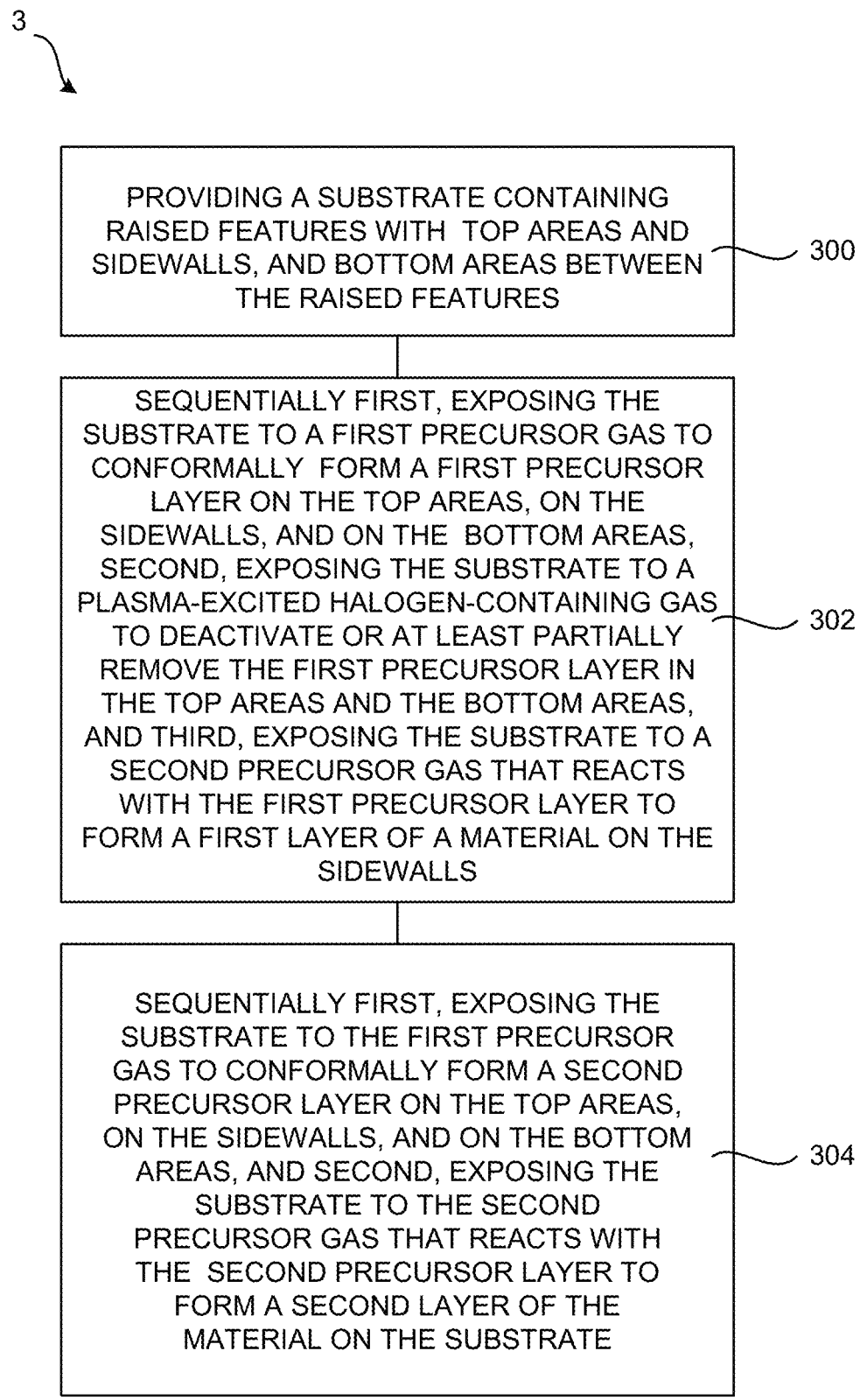
FIG. 3 is a process flow diagram for processing a substrate according to an embodiment of the invention.

FIG. 3 is a process flow diagram for processing a substrate according to an embodiment of the invention, and FIGS. 4A-4G schematically show through cross-sectional views a method of processing a substrate according to an embodiment of the invention.

Figure 4A:
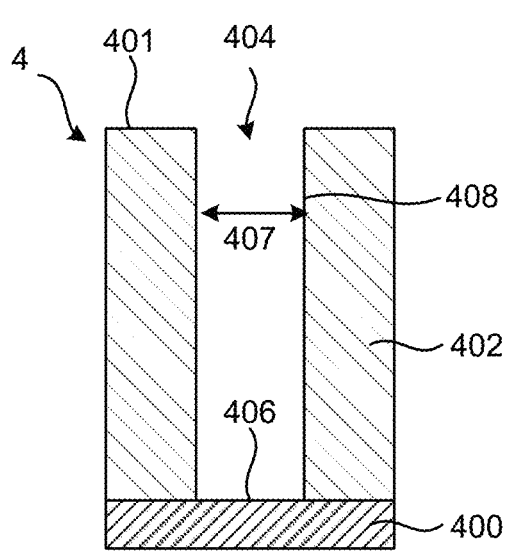
FIGS. 4A-4G schematically show through cross-sectional views a method of processing a substrate according to an embodiment of the invention.

The process flow 3 includes, in 300, providing a substrate 4 containing a base film 400 and raised features 402 with top areas 401 and sidewalls 408, and bottom areas 406 between the raised features 402. As shown in FIG. 4A, the raised features 402 define a recessed feature 404 having a width 407 between the raised features 402.

Figure 4B:
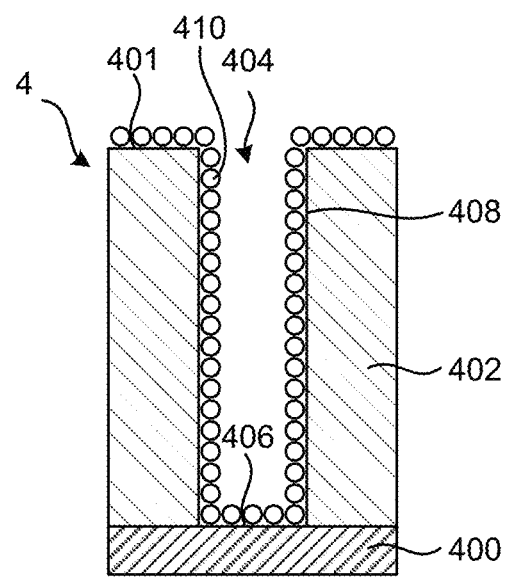
Figure 4C:
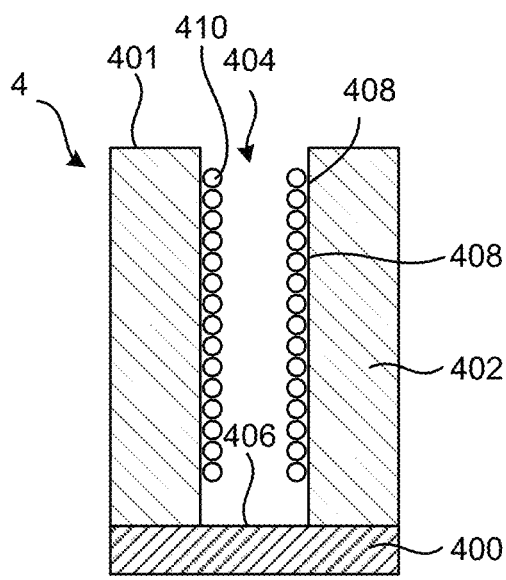
Figure 4D:
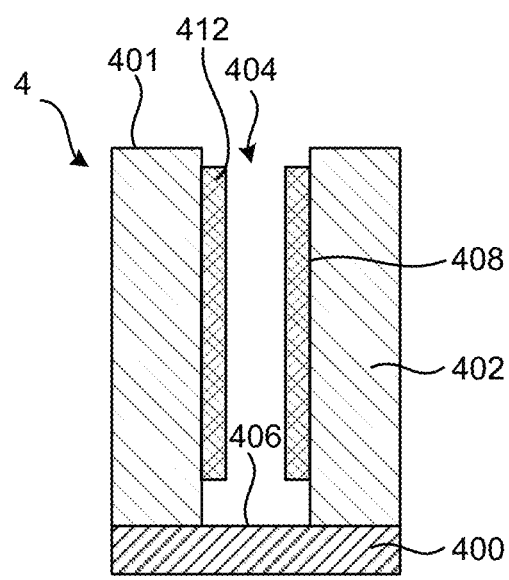
Figure 4E:
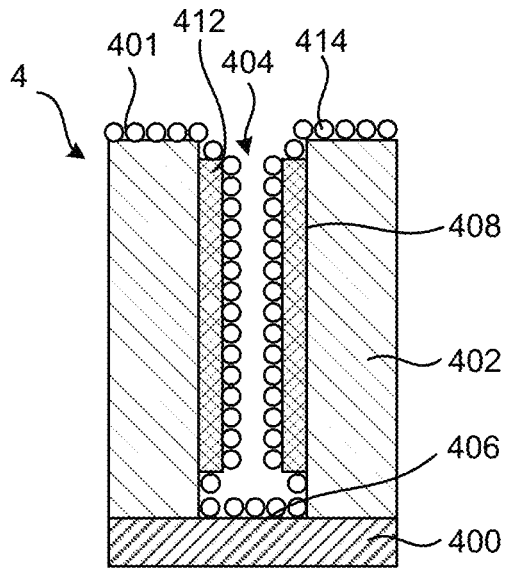
Figure 4F:
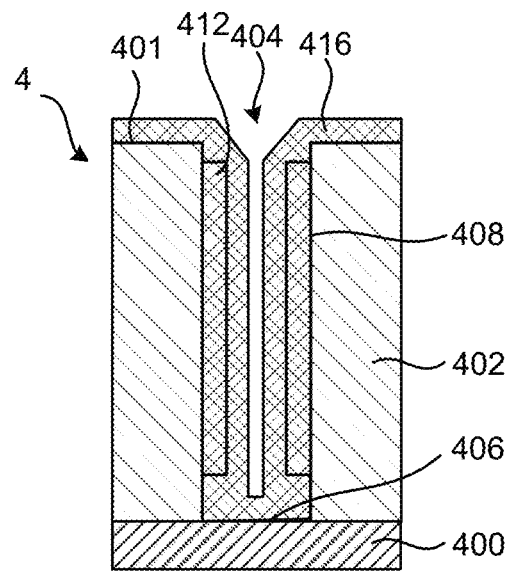

The process flow 3 further includes exposing the substrate 4 to a gas pulse sequence to deposit a material that forms an air gap on the substrate 4, where the gas pulse sequence includes, in any order: in 302, sequentially first, exposing the substrate to a first precursor gas to conformally form a first precursor layer on the top areas, on the sidewalls, and on the bottom areas (FIG. 4B), second, exposing the substrate to a plasma-excited halogen-containing gas to deactivate or at least partially remove the first precursor layer in the top areas and the bottom areas (FIG. 4C), and third, exposing the substrate to the second precursor gas that reacts with the first precursor layer to form a first layer of the material on the sidewalls (FIG. 4D), and in 304, sequentially first, exposing the substrate to a first precursor gas to conformally form a second precursor layer on the top areas, on the sidewalls, and on the bottom areas (FIG. 4E), and second, exposing the substrate to the second precursor gas that reacts with the second precursor layer to form an additional layer of the material on the substrate (FIG. 4F). Steps a), b) or a) and b), may be repeated at least once to increase a thickness of the first and second material layers.

FIG. 4B shows the first precursor layer 410 that is conformally formed on the top areas 401, on the sidewalls 408, and on the bottom areas 406. According to one embodiment, the first precursor layer 410 may be deposited using a saturated exposure of the first precursor gas.

FIG. 4C shows the first precursor layer 410 following exposing the substrate 4 to a plasma-excited halogen-containing gas. The exposure to the plasma-excited halogen-containing gas removes the first precursor layer 410 from the top areas 401 and the bottom areas 406. Non-limiting examples of the halogen-containing gas contain $Cl_2$, $BCl_3$, $CCl_4$, HCl, HBr, $TiCl_4$, or a combination thereof. The halogen-containing gas can further include an inert gas such as Argon (Ar). In some examples, the plasma-excitation may be performed using a high density plasma source, for example an inductively coupled plasma (ICP) source or a microwave plasma source. The substrate 4 may be biased through a substrate holder to further enhance the anisotropic characteristics of the plasma exposure. Further, processing conditions such as substrate temperature, gas pressure, and plasma power, may be selected to control the removal of the first precursor layer 410 and to minimize the damage to the substrate 4.

FIG. 4D shows the formation of a first layer of material 412 from exposure of the second precursor gas that reacts with the first precursor layer 410 in FIG. 4C on the sidewalls 408.

FIG. 4E shows the second precursor layer 414 that is conformally formed on the top areas 401, on the sidewalls 408, and on the bottom areas 406. The second precursor layer 414 may be deposited using a saturated exposure of the first precursor gas that reaches and saturates the bottom areas 406 between the raised features 402.

FIG. 4F shows the formation of a second layer of material 416 from exposure of the second precursor gas that reacts with the second precursor layer 414 in FIG. 4E.

Figure 4G:
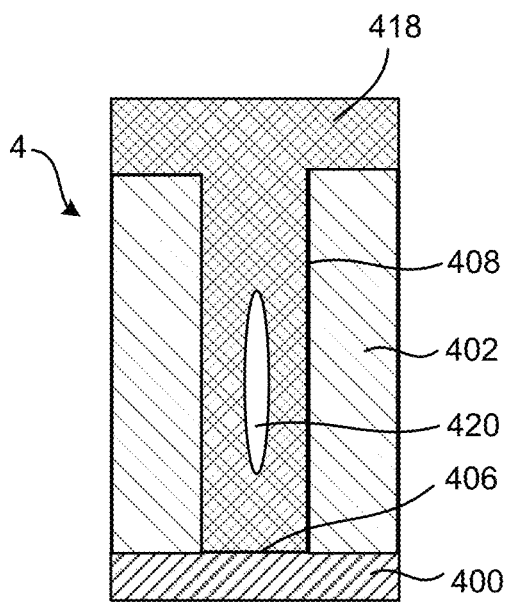

Steps 302, 304, or both 302 and 304, may be repeated at least once until an air gap is formed on the substrate 4. Steps 302 and 304 may be performed in any order, i.e., step 302 before step 304, or step 304 before step 302. FIG. 4G shows the formation of an air gap 420 in the material 418 following deposition of additional material until the recessed feature 404 is pinched off near the top. The material 418 containing the air gap 420 includes the first layer of material 412, the second layer of material 416, and any further materials needed to close the opening near the top of the recessed feature 404.

A plurality of embodiments for a method of fabricating air gaps in advanced semiconductor devices have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
providing a substrate containing raised features with top areas and sidewalls, and bottom areas between the raised features; and
exposing the substrate to a gas pulse sequence to deposit a material that forms an air gap between the raised features, wherein the gas pulse sequence includes, in any order:
a) sequentially first, exposing the substrate to a first precursor gas to non-conformally form a first precursor layer on the top areas and on upper parts of the sidewalls, but not on lower parts of the sidewalls and the bottom areas, and second, exposing the substrate to a second precursor gas that reacts with the first precursor layer to form a first layer of the material on the substrate, and
b) sequentially first, exposing the substrate to the first precursor gas to conformally form a second precursor layer on the top areas, on the sidewalls, and on the bottom areas, and second, exposing the substrate to the second precursor gas that reacts with the second precursor layer to form a second layer of the material on the substrate.

2. The method of claim 1, further comprising
repeating steps a), b), or a) and b), at least once until the air gap is formed.

3. The method of claim 1, wherein the first precursor gas contains a metal-containing precursor.

4. The method of claim 3, wherein the first and second precursor layers are selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

5. The method of claim 1, wherein the first precursor gas contains aluminum, titanium, or a combination thereof.

6. The method of claim 1, wherein the first and second layers of the material contain $SiO_2$.

7. The method of claim 1, wherein the second precursor gas includes a silanol gas.

8. The method of claim 7, wherein the silanol gas is selected from the group consisting of tris(tert-pentoxy) silanol, tris(tert-butoxy) silanol, and bis(tert-butoxy)(isopropoxy) silanol.

9. The method of claim 1, wherein first precursor gas contains $AlMe_3$ and the second precursor gas contains tris (tert-pentoxy) silanol.

10. The method of claim 1, wherein the exposing the substrate to the second precursor gas includes:
   in the absence of any oxidizing and hydrolyzing agent, exposing the substrate at a substrate temperature of approximately 150° C. or less, to a process gas containing a silanol.

\* \* \* \* \*